United States Patent [19]
Tani et al.

[11] Patent Number: 5,444,613
[45] Date of Patent: Aug. 22, 1995

[54] DEVICE FOR GENERATING A SIGNAL REPRESENTATIVE OF THE POSITION OF AN ANGULARLY OR LINEARLY MOVEABLE MEMBER

[75] Inventors: Makoto Tani; Takashi Nishijima, both of Tokyo, Japan

[73] Assignee: TEAC Corporation, Tokyo, Japan

[21] Appl. No.: 224,395

[22] Filed: Apr. 7, 1994

Related U.S. Application Data

[63] Continuation of Ser. No. 737,158, Jul. 29, 1991, abandoned.

[30] Foreign Application Priority Data

Jul. 30, 1990 [JP] Japan .................. 2-201734

[51] Int. Cl.$^6$ .................. G05B 19/18; G05B 1/06; H03M 1/22
[52] U.S. Cl. .................. 364/167.01; 318/640; 341/13
[58] Field of Search .............. 364/167.01, 559, 474.28, 364/561; 313/640, 685; 341/9, 13

[56] References Cited

U.S. PATENT DOCUMENTS

| | | | |
|---|---|---|---|
| 2,950,428 | 8/1960 | Gievers | 318/640 |
| 3,004,251 | 10/1961 | Rapacz | 318/640 |
| 3,193,744 | 7/1965 | Seward | 318/640 |
| 3,956,681 | 5/1976 | Vail et al. | 318/640 |
| 4,009,377 | 2/1977 | Elms | 364/561 |
| 4,024,446 | 5/1977 | Burnett | 318/685 |
| 4,422,026 | 12/1983 | Starai | 318/640 |
| 4,429,267 | 1/1984 | Veale | 318/594 |
| 4,470,108 | 9/1984 | Kato et al. | 364/167.01 |
| 4,604,725 | 8/1986 | Davies et al. | 364/561 |
| 4,611,269 | 9/1986 | Suzuki et al. | 364/174 |
| 4,633,224 | 12/1986 | Gipp et al. | 341/13 |
| 4,766,359 | 9/1988 | Smith et al. | 318/652 |
| 4,901,072 | 2/1990 | Fox | 341/10 |
| 4,907,178 | 3/1990 | Ogawa et al. | 364/559 |
| 4,914,437 | 4/1990 | Kibrick et al. | 341/3 |
| 5,049,879 | 9/1991 | Symonds | 341/10 |

*Primary Examiner*—Paul P. Gordon
*Attorney, Agent, or Firm*—Woodcock Washburn Kurtz Mackiewicz & Norris

[57] ABSTRACT

A digital position signal generator suitable for gain control and other purposes. A typical embodiment includes a rotary disk notionally divided into a plurality of sectors of the same angle about the disk axis. Some of the disk sectors have radial extensions which are detectable by photocouplers. The photocouplers are fixedly disposed about the disk axis with angular spacings each greater than the angle of each disk sector. Thus, with the rotation of the disk, the photocouplers produce binary zero and one outputs in various predetermined combinations nonsequentially representing successive predetermined angular positions of the disk. A position data generator circuit such as a microcomputer is provided which has stored thereon meaningful position data sequentially representing the successive predetermined angular positions of the disk. Inputting each output combination of the detectors, the position data generator circuit puts out a corresponding one of the meaningful position data. Several other embodiments are disclosed.

12 Claims, 6 Drawing Sheets

DEVICE FOR GENERATING A SIGNAL REPRESENTATIVE OF THE POSITION OF AN ANGULARLY OR LINEARLY MOVEABLE MEMBER

This is a continuation, of application Ser. No. 07/737,158, filed Jul. 29, 1991, now abandoned.

BACKGROUND OF THE INVENTION

Our invention relates to a device for generating an electric signal indicative of the variable position of a member capable of either angular or linear displacement relative to means for sensing such displacement. The position signal generator according to our invention lends itself to use for gain control or as a rotary encoder, among other applications.

We know several prior art devices for generating a signal representative of the angular position of a rotary member such as a control knob. Typical of such known devices was a variable resistor comprising a fixed resistive element of arcuate shape across which a constant voltage was to be applied, and a voltage dividing contact movable in sliding engagement with the resistive element. A voltage fraction could be obtained which corresponded to the angular position of the movable contact with respect to the resistive element. Although simple in construction, this known device had the disadvantage that its performance deteriorated with time through abrasion of the resistive element and the movable contact.

Another prior art device employed a rotary disk bearing a series of index marks at constant circumferential spacings. Any angular position of the rotary disk was ascertained on the basis of the number of index marks that were detected from a reference position to the arbitrary angular position of the disk. This second prior art device was also comparatively simple in construction and, being free from relatively sliding parts, defeated the above recited disadvantage of the first recited prior art device. These advantages were offset, however, by the need for initially resetting the disk to the reference position.

The noted weaknesses of the two foregoing prior art devices were absent from still another conventional device that employed a set of concentric rings having discrete conductor regions in preselected angular positions thereof. A plurality of detectors or sensors were provided for detecting the conductor regions on the concentric rings. Various angular positions of the concentric rings were digitally represented by various combinations of binary zero and one outputs from the detectors. We object to this third known device, too, by reason of its bulk as an inevitable result of the use of the concentric rings.

SUMMARY OF THE INVENTION

We have hereby invented how to construct a simple, inexpensive and compact position signal generator that is free from all the listed drawbacks of the prior art.

Stated in its broadest aspect, our invention may be summarized as a position signal generator comprising a member, and a plurality of detectors each capable of producing binary zero and one outputs. Either of the member and the set of detectors is movable relative to the other along a predetermined path, with the detectors disposed along the path. The member is notionally divided into a series of sections extending along the path, with each section being of the same dimension in a direction parallel to the path. The notional sections are comprised of detectable sections which are detectable by the detectors, and undetectable sections which are undetectable by the detectors. The arrangement of the detectable and the undetectable sections conforms to the arrangement of the output pulses of a maximum sequence pseudorandom pulse generator. The detectors are disposed with spacings each greater than or equal to the dimension of each notional section of the member in a direction parallel to the predetermined path. Thus, with the relative movement of the member and the detectors, the detectors produce the binary zero and one outputs in various predetermined combinations which nonsequentially represent a series of predetermined relative positions of the member and the detectors. The device further comprises position data generator means having stored thereon meaningful position data sequentially representing the series of predetermined relative positions of the member and the detectors. Connected to the detectors, the position data generator means functions to translate each output combination of the detectors into a corresponding one of the meaningful position data.

In a preferred embodiment of our invention, the above recited member takes the form of a rotary disk notionally divided into a plurality of sectors of the same angle about the disk axis. These notional disk sectors are comprised of detectable sectors each having a radial extension, and undetectable sectors having no such extension. Also, in this particular embodiment, the detectors take the form of photocouplers capable of optically detecting the radial extensions of the disk.

As has been mentioned, the arrangement of the radial disk extensions is determined by the arrangement of the output pulses of a maximum sequence pseudorandom pulse generator. Consequently, the various combinations of the binary zero and one outputs produced by the photocouplers during one complete revolution of the disk to represent a series of predetermined angular positions of the disk are all unlike one another. Thus each output combination of the photocouplers uniquely represents one of the predetermined angular positions of the disk. However, the output combinations of the photocouplers are random, not interrelated, and so cannot be put to useful purposes as such.

We have therefore connected the photocouplers to the position data generator means which typically takes the form of a microcomputer. The microcomputer includes a read only memory on which there are stored the meaningful or interrelated position data sequentially representing the successive predetermined angular positions of the disk with respect to the detectors. Inputting each combination of the binary outputs from the photocouplers, the microcomputer puts out that one of the meaningful position data which corresponds to the photocoupler output combination.

It will therefore be appreciated that our invention, as embodied in the embodiment set forth above and to be detailed subsequently together with additional embodiments, requires but one rotary disk and a set of photocouplers, aside from associated electronic hardware. Moreover, the photocouplers need not contact the rotary disk for detection of its angular positions. It is also an advantage that any predetermined angular positions of the disk can be known without need for initializing or resetting the disk. We have thus succeeded in defeating all the listed weaknesses of the prior art.

Generally, according to our invention, the arrangement of the detectable and undetectable notional sections of the member whose positions are to be ascertained relative to the set of detectors may be determined in conformity with one cycle, or more or less than one cycle, of the output pulses of a maximum sequence pseudorandom pulse generator. It is also to be noted that our invention is applicable to the detection of the positions of either an angularly or a linearly movable member.

The above and other features and advantages of our invention and the manner of realizing them will become more apparent, and the invention itself will best be understood, from a study of the following description and appended claims, with reference had to the attached drawings showing the preferred embodiments of our invention.

DESCRIPTION OF THE PREFERRED EMBODIMENTS

Figure 1:
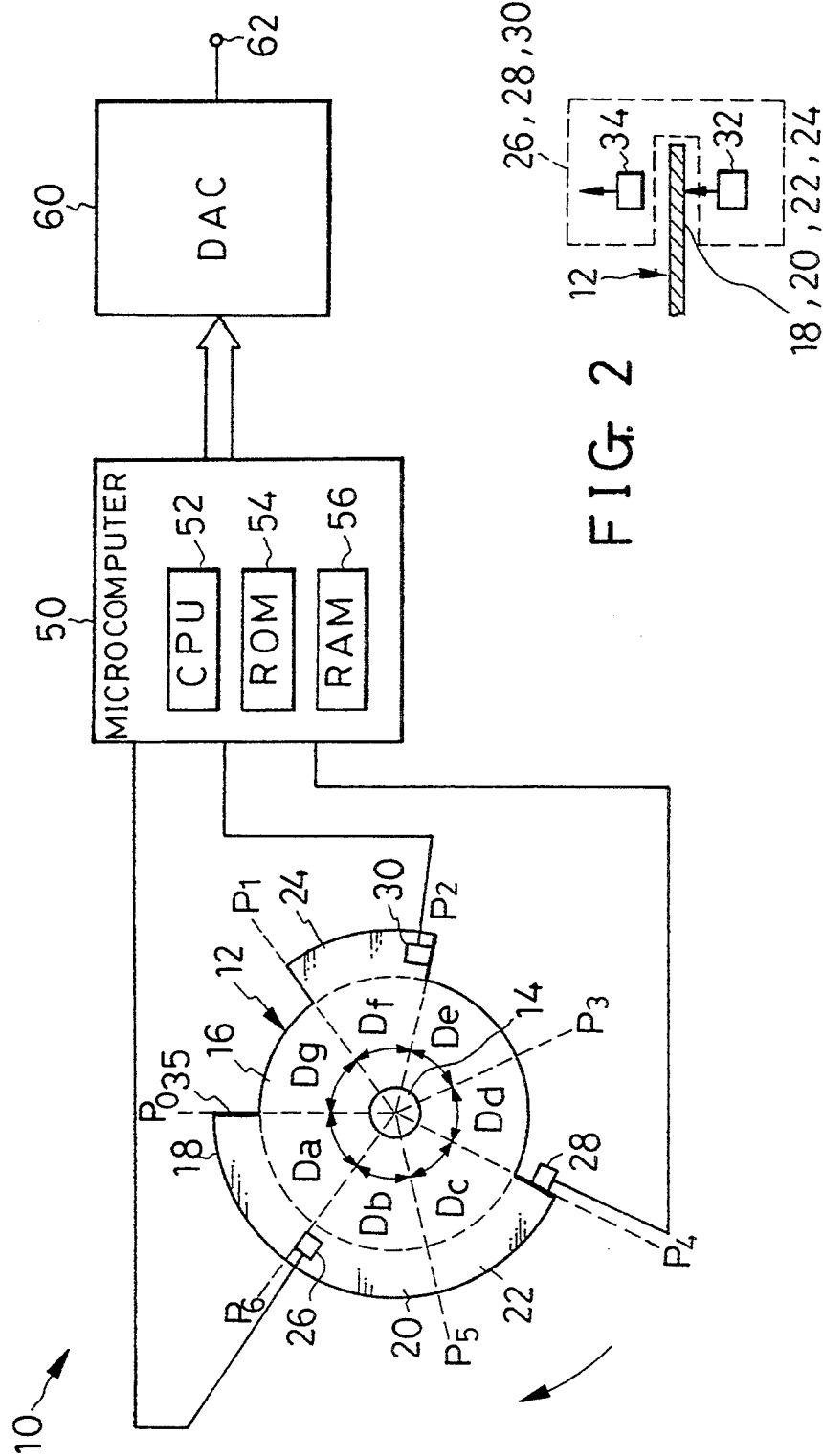
FIG. 1 is a schematic illustration, partly in block diagrammatic form, of our invention as adapted for detecting a series of predetermined angular positions of a rotary disk for use as a gain controller.

We will now describe our invention in detail as embodied in the gain controller diagramed schematically in FIG. 1 and therein generally designated 10. The electronic volume 10 has a rotary disk 12 mounted fast on a rotary shaft 14 for joint rotation therewith. The rotary shaft 14 is to be revolved as by a knob, not shown, mounted thereon. The rotary disk 12 has a major portion 16 of circular shape and a plurality of, four in this particular embodiment, radially outward extensions 18, 20, 22 and 24. The first three disk extensions 18, 20 and 22 are shown continuously joined to one another whereas the fourth extension 34 is isolated from the rest. All these extensions 18, 20, 22 and 24 of the rotary disk 12 are intended to serve as light beam interrupters of photocouplers to be set forth presently.

The disk extensions 18–24 are all of the same angular width about the axis of the rotary disk 12, namely, 360 degrees divided by $(2^n - 1)$, where n is an integer of not less than two. Let us assume that n is three in this particular embodiment. Then the angles of the disk extensions 18–24 are each 360/7 degrees.

Figure 2:
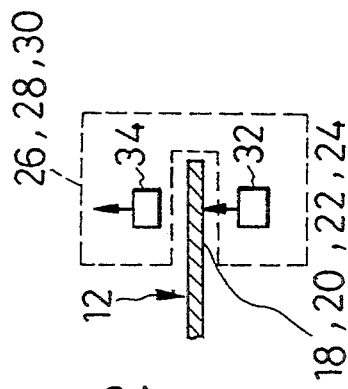
FIG. 2 is a schematic illustration of each photocoupler used as a detector in the FIG. 1 embodiment, the photocoupler being shown together with part of the rotary disk.

For detecting the four extensions 18, 20, 22 and 24 on the rotary disk 12 we have employed three detectors in the form of photocouplers 26, 28 and 30. By the term "photocoupler" we mean a combination of a light source 32 and a photoreceptor 34, FIG. 2, which are disposed opposite each other across the path of the disk extensions 18, 20, 22 and 24. The beam of light emitted by the light source 32 falls on the photoreceptor 34 in the absence of the disk extensions 14, 16, 18, 20, 22 and 24 from therebetween but does not in the presence of any of the disk extensions therebetween. The output from each of the photocouplers 26, 28 and 30 is high (binary one) when any of the disk extensions 14, 16, 18, 20, 22 and 24 intervenes between its light source 32 and photoreceptor 34, and low (binary zero) when none of the disk extensions intervenes therebetween.

With reference back to FIG. 1 the indicia $P_0$, $P_1$, $P_2$, $P_3$, $P_4$, $P_5$ and $P_6$ denote seven fixed reference angular positions having constant spacings of 360/7 degrees about the axis of the rotary disk 12. The radial edge or boundary 35 of the disk extension 18 is herein shown aligned with the first reference position $P_0$. The rotary disk 12 may then be thought of as being in the position $P_0$. Similarly, the rotary disk 12 is in the second reference position $P_1$ when the disk extension boundary 35 is brought into alignment therewith, in the third reference position $P_2$ when the disk extension boundary 35 is brought into alignment therewith, and so forth. Thus a total of seven different angular a positions, constantly spaced 360/7 degrees about the disk axis, of the rotary disk 12 are to be detected in this embodiment.

The three photocouplers 26, 28 and 30 are disposed at three preselected ones $P_6$, $P_4$ and $P_2$ of the seven reference positions $P_0$–$P_6$ in this particular embodiment and along the circular path of the disk extensions 18, 20, 22 and 24. In any event the angular spacings between the photocouplers 26, 28 and 30 about the disk axis should each be greater than or equal to the angular spacing between any two of the reference positions $P_0$–$P_6$.

Thus, with the rotation of the disk 12, the three photocouplers 26, 28 and 30 are to provide binary zero and one outputs in various predetermined combinations depending upon the angular positions of the disk with respect to the seven reference positions $P_0$–$P_6$. The seven different angular positions of the disk 12 are thus detectable on the basis of the combinations of the binary outputs from the photocouplers 26–30 in the manner set forth hereafter.

Figure 3:
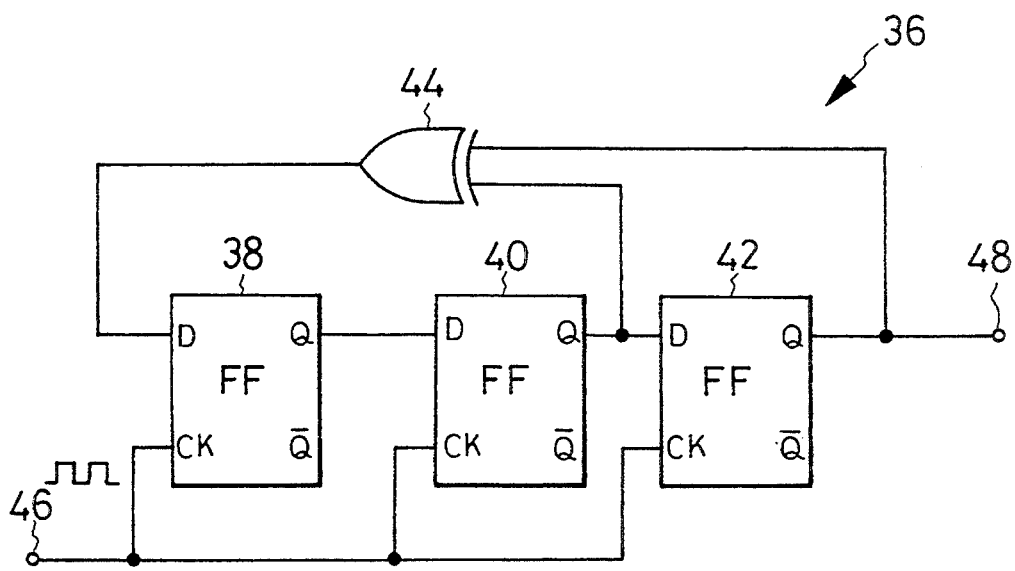
FIG. 3 is a block diagram of a known maximum sequence pseudorandom pulse generator.

We have determined the noted arrangement of the four disk extensions 18–24 in relation to one cycle of the output pulses of an n bits maximum sequence pseudorandom pulse generator which is per se well known to the specialists. FIG. 3 is a diagram of a familiar three bits maximum sequence pseudorandom pulse generator 36. It has three D flip flops 38, 40 and 42, an exclusive OR gate 44, a clock input terminal 46 and an output terminal 48, which are connected as shown.

Figure 4:
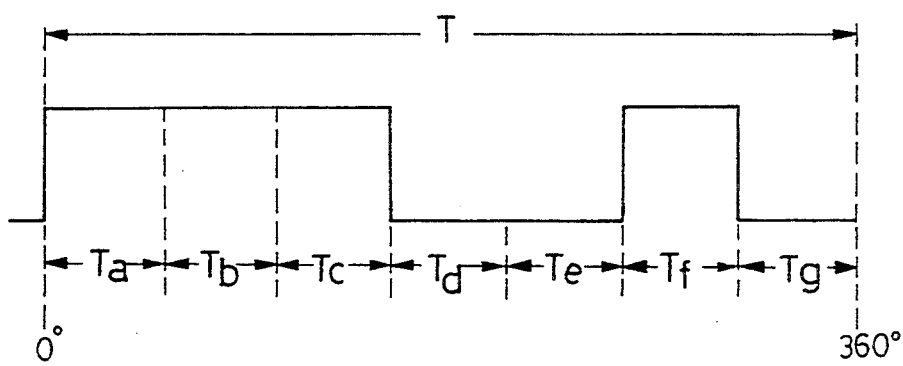
FIG. 4 is a waveform diagram of one cycle of output pulses of the maximum sequence pseudorandom pulse generator.

FIG. 4 shows one cycle T of maximum sequence pseudorandom pulses obtained at the outputs 48 of the pulse generator 36 upon application of clock pulses to the clock inputs CK of the three flip flops 38–42 through the input terminal 46. This cycle T of pseudorandom pulses is shown equally divided into seven sections Ta, Tb, Tc, Td, Te, Tf and Tg. The sections Ta, Tb, Tc and Tf are high (binary one) whereas the other sections Td, Te and Tg are low (binary zero).

As will be noted by reference back to FIG. 1, the rotary disk 12 is therein shown notionally divided into seven sectors Da, Db, Dc, Dd, De, Df and Dg of the same angle about the disk axis. The disk sectors Da, Db, Dc and Df have the radial extensions 18, 20, 22 and 24, respectively, as so that these disk sectors are detectable by the photocouplers 26, 28 and 30. The other disk sectors $D_d$, $D_e$ and $D_g$ have no radial extensions and so are undetectable by the photocouplers 26, 28 and 30. The detectable disk sectors Da, Db, Dc and Df correspond respectively to the high sections Ta, Tb, Tc and Tf of the maximum sequence pseudorandom pulse cycle T, FIG. 4, and the undetectable disk sectors $D_d$, $D_e$ and $D_g$ correspond respectively to the low sections Td, Te and Tg of the pulse cycle T.

The three detectors or photocouplers 26, 28 and 30 are all connected to a position signal generator circuit herein shown as a digital microcomputer 50 comprising a central processor unit (CPU) 52, a read only memory (ROM) 54 and a random access memory 56. The reader's attention is directed to the Table below prior to the discussion of the functions of the microcomputer 50.

|  | Disk Position | | | | | | |
| --- | --- | --- | --- | --- | --- | --- | --- |
| Detector | $P_0$ [000] | $P_1$ [001] | $P_2$ [010] | $P_3$ [011] | $P_4$ [100] | $P_5$ [101] | $P_6$ [110] |
| 26 | 1 | 1 | 0 | 0 | 1 | 0 | 1 |
| 28 | 0 | 0 | 1 | 0 | 1 | 1 | 1 |
| 30 | 1 | 0 | 1 | 1 | 1 | 0 | 0 |

As indicated in the table, the binary outputs from the photocouplers 26, 28 and 30 are [101] when the rotary disk 12 is in the position $P_0$, [100] when the disk is in the position $P_1$, [011] when the disk is in the position $P_2$, and so forth. Thus the seven combinations of the binary outputs from the photocouplers 26, 28 and 30, representative of the seven disk positions $P_0$-$P_6$, are all unlike each other, so that each output combination can uniquely represent one of the seven disk positions.

However, the binary output combinations of the photocouplers 26, 28 and 30 are quite random and have no regularity with respect to the successive disk positions $P_0$-$P_6$. The microcomputer 50 functions to translate such random or nonsequential combinations of the outputs from the photocouplers 26, 28 and 30 into more meaningful binary coded digital disk position data that have regularity in the sequence of the seven successive angular positions $P_0$-$P_6$ of the rotary disk 12. The table above also lists such meaningful disk position data as [000], [001], [010], etc., immediately under the disk positions $P_0$, $P_1$, $P_2$, etc.

For such deciphering of the digital outputs from the photocouplers 26, 28 and 30, the microcomputer 50 has stored the meaningful disk position data stored in addressable storage locations in its ROM 54. The various combinations of the photocoupler outputs serve as address signals indicative of the addresses of the storage locations in the ROM 54 where the corresponding meaningful disk position data are stored. Therefore, as will be understood from the Table above, the disk position datum [000] representative of the disk position $P_0$ will be read out from the ROM 54 in response to the incoming photocoupler output combination [101], the disk position datum [001] representative of the disk position $P_1$ will be read out in response to the incoming photocoupler output combination [100], and so forth.

The microcomputer 50 is shown connected to a digital to analog converter (DAC) 60 in this particular embodiment and thence to an output terminal 62. Receiving the binary coded digital disk position data from the microcomputer 50, the DAC 60 generates an equivalent analog voltage signal.

Operation

In FIG. 1 is shown the rotary disk 12 in the initial angular position relative to the photocouplers 26-30, with the radial edge or boundary 35 of the first disk extension 18 or disk sector Da aligned with the first reference position $P_0$. Then the second 20 and fourth 24 radial extensions of the rotary disk 12 intervene between the light sources 32, FIG. 2, and photoreceptors 34 of the first 26 and third 30 photocouplers, so that the outputs from these photocouplers 26 and 30 will be both high (binary one). The second photocoupler 28, on the other hand, has no disk extension intervening between its light source and photoreceptor, so that the output from the second photocoupler 28 will be low (binary zero). Thus the three photocouplers 26, 28 and 30 will produce the random disk position datum [101] representative of the first disk position $P_0$.

Inputting the random disk position datum [101], the microcomputer 50 will utilize it as an address signal for reading out the corresponding meaningful disk position datum [000] (see the Table above) from the required storage location in the ROM 54. The DAC 60 will input this meaningful disk position datum [000] and deliver an equivalent analog voltage to the output terminal 62.

When the edge 35 of the first extension 18 of the rotary disk 12 is brought into alignment with the second reference position $P_1$ with the rotation of the disk, the third radial disk extension 22 will come to intervene between the light source and photoreceptor of the first photocoupler 26, so that the output from the first photocoupler will remain high. The second 28 and third 30 photocouplers will have no disk extensions intervening between their light sources and photoreceptors. The outputs from these photocouplers 28 and 30 will therefore be both low. Thus the three photocouplers 26, 28 and 30 will produce the random disk position datum [100] representative of the second disk position $P_1$.

Then, as will be understood by referring again to the Table above, the microcomputer 50 will read out the meaningful disk position datum [001] in response to the incoming random disk position datum [100]. The DAC 60 will input this meaningful disk position datum [100] and produce an equivalent analog voltage.

Likewise, when the edge 35 of the rotary disk extension 18 is brought into alignment with the successive reference positions $P_2$, $P_3$, $P_4$, $P_5$ and $P_6$, the three photocouplers 26, 28 and 30 will produce the random disk position data [011], [001], [111], [010]and [110]. Successively inputting these random disk position data, the microcomputer 50 will translate them into the corresponding meaningful disk position data [010], [011], [100], [101] as and [110]. These meaningful disk position data will also be converted into corresponding analog voltage values by the DAC 60.

Advantages

Having thus disclosed our invention in terms of a first preferred embodiment thereof, we may summarize the advantages gained by this particular embodiment as follows:

1. A desired number of different angular positions of the rotary disk 12 can be accurately determined in the form of digital data despite simplicity in construction.

2. No initialization or resetting of the rotary disk is required for the determination of any of its preselected angular positions.

3. Only three detectors such as photocouplers are needed for the determination of seven different angular positions.

4. The three detectors may be disposed in any three of the seven equal sectors of the rotary disk. The arrangement of the detectors shown in FIG. 1 has been chosen to provide sufficiently large spacings therebetween to avoid mutual interference.

5. The photocouplers employed as the detectors require no contact with the rotary disk for the detection of its radial extensions, so that the device will operate reliably for an extended period of time.

Second Form

Figure 5:
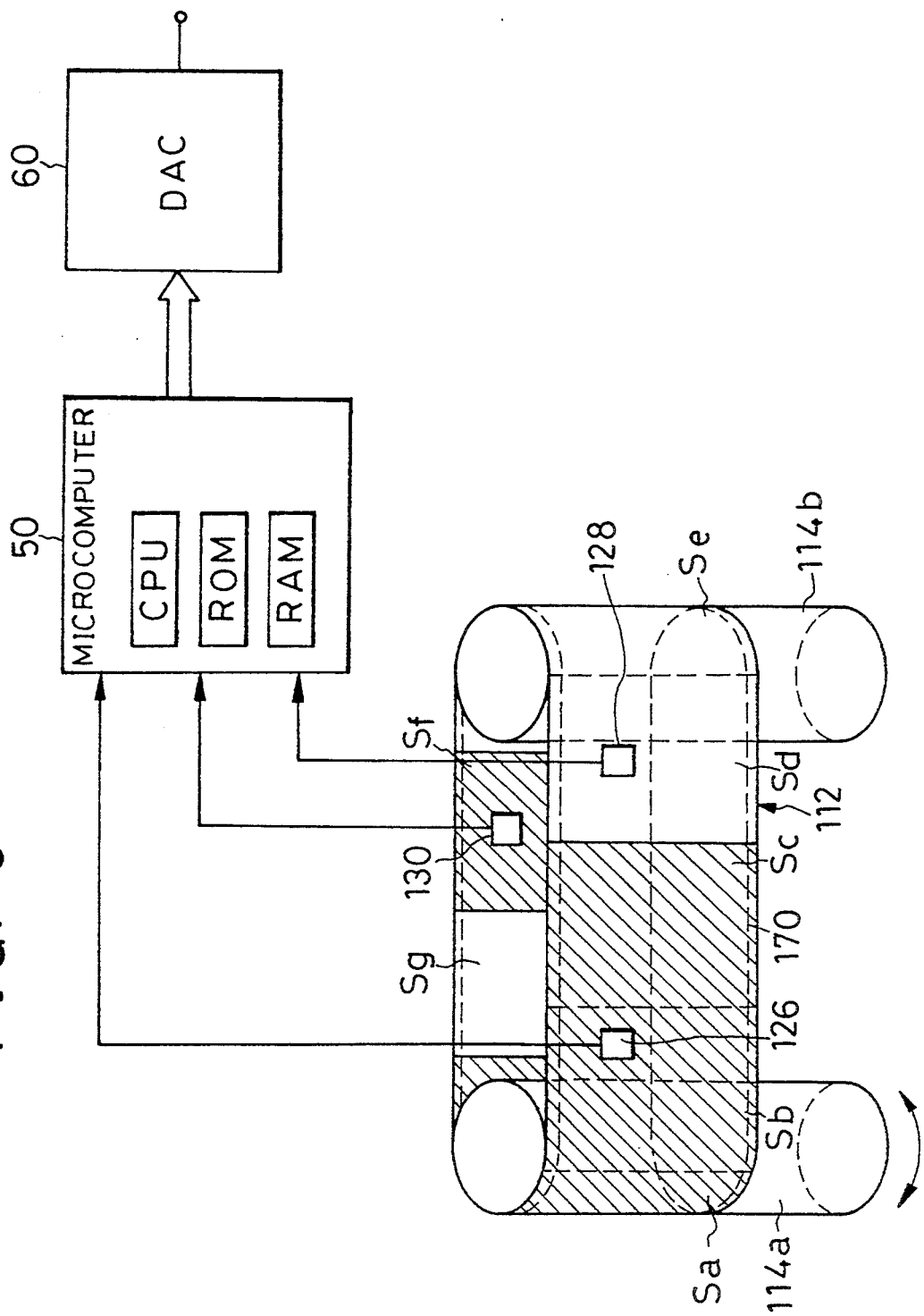
FIG. 5 is a schematic illustration, partly in block diagrammatic form, of another preferred embodiment of our invention.

In FIG. 5 we have shown our invention as adapted for detecting a predetermined number of different longitudinal sections of an endless strip 112 of flexible material, preferably a plastic. The endless strip 112 is wrapped around a drive spool $114_a$ and an idler spool $114_b$, or any other rotary members of cylindrical shape, disposed in parallel spaced relation to each other. The endless strip 112 has two series of perforations 170, shown as broken lines, extending along its opposite edges for positive engagement with as many series of cogs, not shown, on each of the spools 114a and 114b. Thus, as the drive spool 114a is driven by suitable drive means, not shown, coupled thereto, the endless strip 112 is to travel longitudinally around the two spools 114a and 114b.

It will be seen that the endless strip 112 is shown notionally divided transversely into seven sections $S_a$, $S_b$, $S_c$, $S_d$, $S_e$, $S_f$ and $S_g$ of the same dimension in the longitudinal direction of the strip. Of these, the strip sections $S_a$, $S_b$, $S_c$ and $S_f$ are made opaque or impervious to light, as indicated by the hatching, whereas the other strip sections $S_d$, $S_e$ and $S_g$ are made transparent or capable of transmitting light. The opaque sections $S_a$, $S_b$, $S_c$ and $S_f$ correspond to the radial extensions 18, 21, 22 and 24 of the sectors $D_a$, $D_b$, $D_c$ and $D_f$ of the rotary disk 12 of the FIG. 1 embodiment. Therefore, as has been set forth with reference to FIG. 4, the opaque sections $S_a$, $S_b$, $S_c$ and $S_f$ are arranged like the set of output pulses of a maximum sequence pseudorandom pulse generator.

Also as in the FIG. 1 embodiment, three detectors or photocouplers as 126, 128 and 130 are fixedly disposed in the same positional relation to the sections $S_a$-$S_g$ of the endless strip 112 as the photocouplers 26, 28 and 30 are to the sectors $D_a$-$D_g$ of the rotary disk 12. It will therefore be apparent that the photocouplers 126, 128 and 130 produce binary outputs in various combinations depending upon the longitudinal position of the endless strip 112 relative to the photocouplers.

FIG. 5 also shows that the photocouplers 126, 128 and 130 are all connected to the microcomputer 50 and thence to the DAC 60. Therefore, with the rotation of the endless strip 112, there can be obtained the meaningful digital position data indicative of the longitudinal position of the strip with respect to the photocouplers.

Third Form

Figure 6:
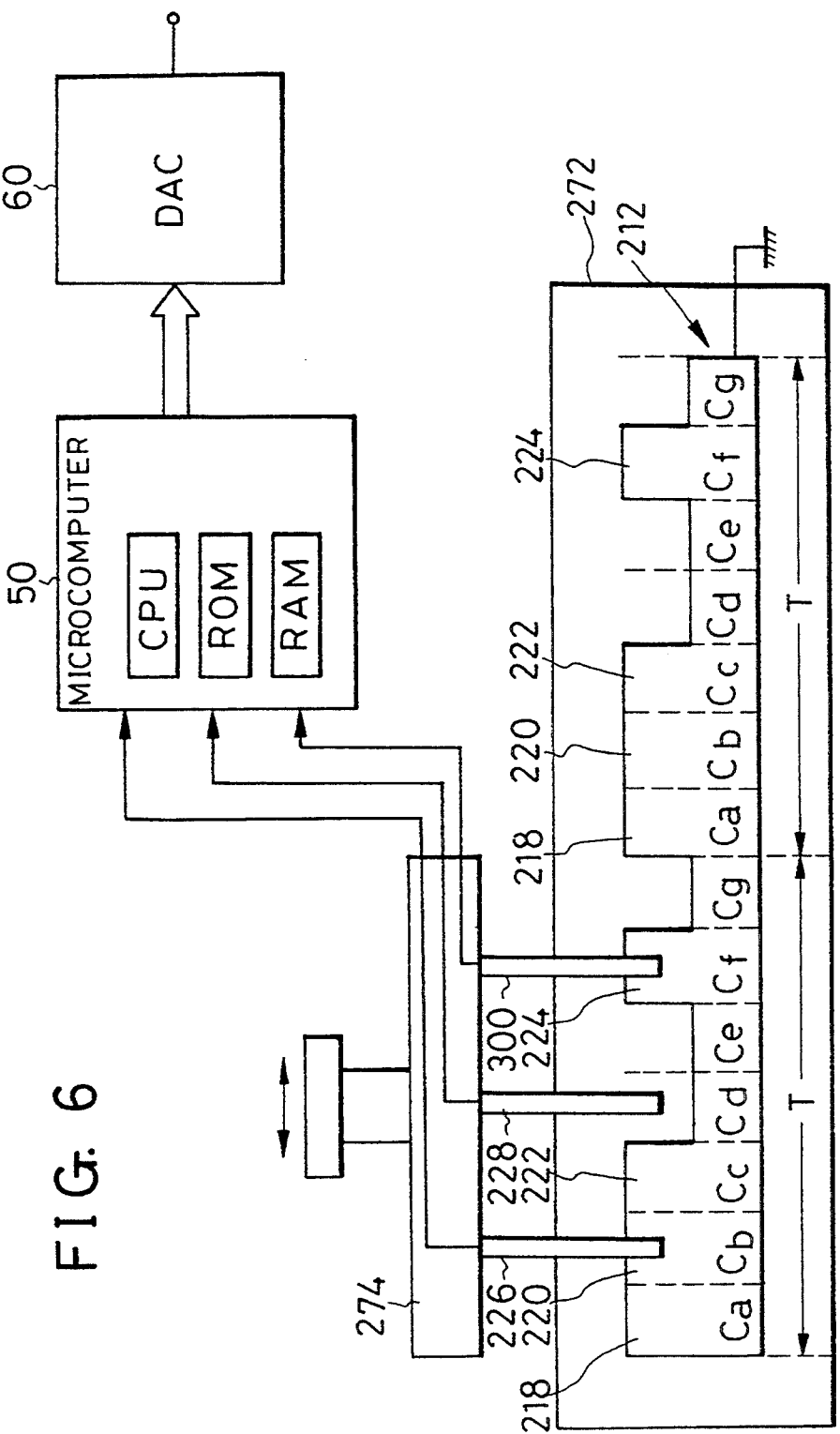
FIG. 6 is a schematic illustration, partly in block diagrammatic form, of still another preferred embodiment of our invention.

FIG. 6 shows the third preferred embodiment of our invention featuring a strip 212 of electrically conductive material formed on an elongate baseplate 272. The conductive strip 212 is grounded and herein shown notionally divided transversely into fourteen sections in order to provide a conductive pattern corresponding to two cycles T, FIG. 4, of the output pulses of a maximum sequence pseudorandom pulse generator. Thus the fourteen sections of the conductive strip 212 are designated $C_a$, $C_b$, $C_c$, $C_d$, $C_e$, $C_f$, $C_g$, $C_a$, $C_b$, $C_c$, $C_d$, $C_e$, $C_f$ and $C_g$. Of these, both $C_a$, $C_b$, $C_c$ and $C_f$ sections have a total of eight transverse extensions 218, 220, 222 and 224.

This third embodiment employs three movable contacts or sliders of electrically conductive material 226, 228 and 230 as the detectors for detecting the transverse extensions 218, 220, 222 and 224 of the conductive strip 212 by moving into and out of sliding contact therewith. The sliders 226, 228 and 230 are in the same positional relation to each set of sections $C_a$-$C_g$ of the conductive strip 212 as the photocouplers 26, 28 and 30 are to the sectors $D_a$-$D_g$ of the rotary disk 12 in the FIG. 1 embodiment, and as the photocouplers 126-128 are to the sections $S_a$-$S_g$ of the endless strip 112 in the FIG. 5 embodiment.

The sliders 226, 228 and 228 are shown as slender arms of metal cantilevered to a carriage 274 movable back and forth along the baseplate 272 in the longitudinal direction of the conductive strip 212. Extending from the carriage 274 in parallel spaced relation to one another, the sliders 226, 228 and 230 are self biased for sliding engagement with the transverse extensions 218, 220, 222 and 224 of the conductive strip 212. The sliders 226, 228 and 230 are electrically connected to the microcomputer 50 and thence to the DAC 60. Thus, as the carriage 274 travels back and forth along the conductive strip 212, there can be obtained the meaningful digital position data representative of the various preselected positions of the carriage with respect to the conductive strip.

Fourth Form

Figure 7:
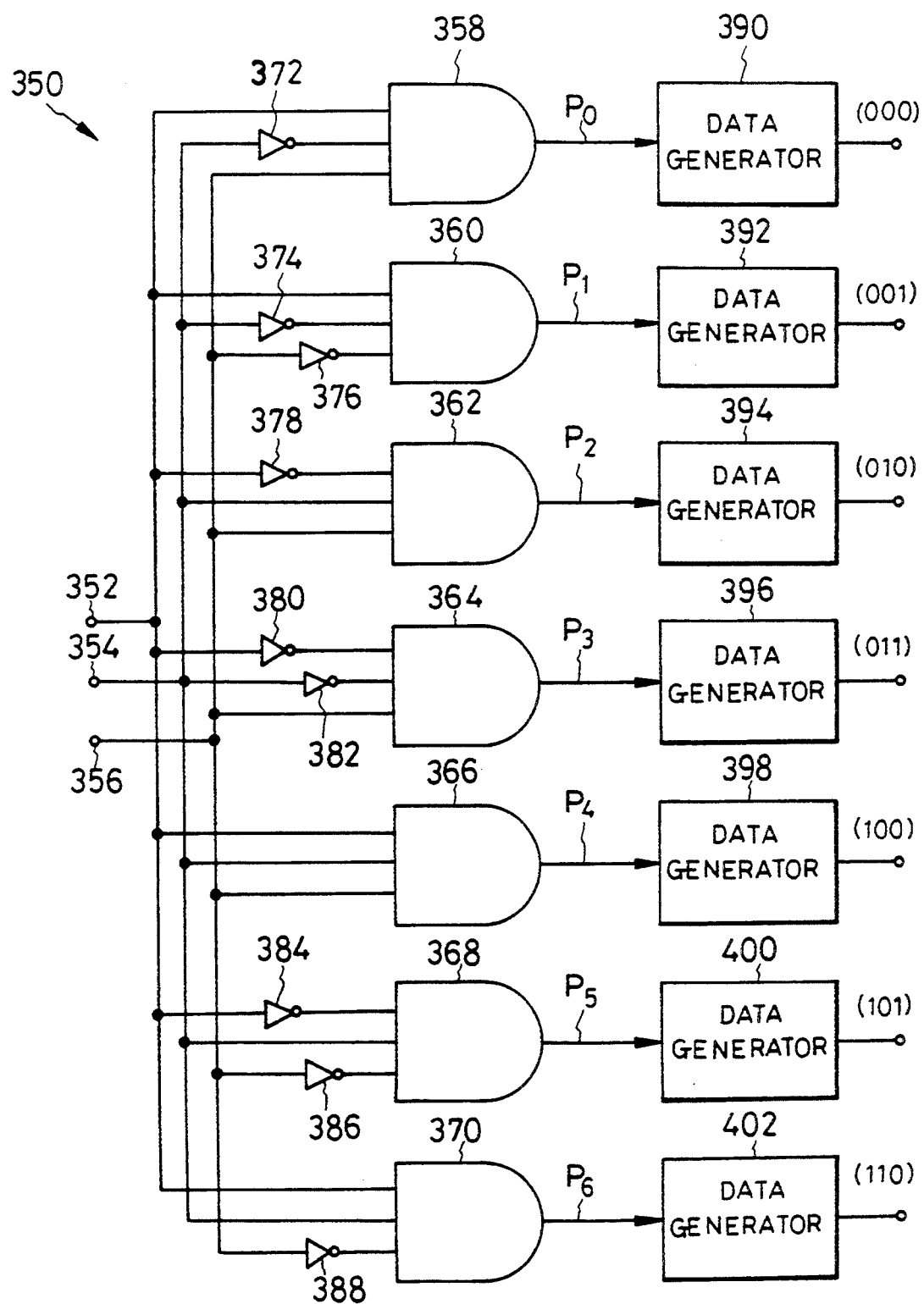
FIG. 7 is a schematic electrical diagram of alternative position data generator means to be employed in substitution for the microcomputer in the FIGS. 1, 5 and 6 embodiments.

FIG. 7 shows a decoder 350 which may be employed in place of the microcomputer 50 used in all the foregoing embodiments of our invention. For the ease of understanding, however, let us assume that this particular decoder is employed in substitution for the microcomputer 50 of the FIG. 1 embodiment.

The decoder 350 has three input terminals 352, 354 and 356 for inputting the binary outputs from the photocouplers 26, 28 and 30 of FIG. 1. The input terminals 352–354 are connected to each of seven three input AND gates 358, 360, 362, 364, 366, 368 and 370 either directly or via a NOT circuit or inverter 372, 374, 376, 378, 380, 382, 384, 386 or 388.

The NOT circuits 372, 374, 376, 378, 380, 382, 384, 386 and 388 are intended to invert the binary zero outputs from the photocouplers 26, 28 and 30 specified in the Table above. Suppose that the seven AND gates 358–370 correspond respectively to the seven preselected disk positions $P_0$–$P_6$. Then, as will be understood by referring to the Table, the first AND gate 358 is connected directly to the first 352 and third 356 input terminals and via the NOT circuit 372 to the second input terminal 354. The second AND gate 360 is connected directly to the first input terminal 352 and via the NOT circuits 374 and 376 to the second 354 and third 356 input terminals. The third AND gate 362 is connected via the NOT circuit 378 to the first input terminal 352 and directly to the second 354 and third 356 input terminals. The fourth AND gate 364 is connected via the NOT circuits 380 and 382 to the first 352 and second 354 input terminals and directly to the third input terminal 356. The fifth AND gate 366 is connected directly to all the input terminals 352, 354 and 356. The sixth AND gate 368 is connected via the NOT circuits 384 and 386 to the first 352 and third 356 input terminals and directly to the second input terminal 354. The seventh AND gate 370 is connected directly to the first 352 and second 354 input terminals and via the NOT circuit 388 to the third input terminal 356.

Thus the seven AND gates 358, 360 and 362, 364, 366 and 370 go high when the rotary disk 12 is in the positions $P_0$–$P_6$, respectively. These outputs from the AND gates 358, 360, 362, 364, 366 and 370 are, however, per se meaningless and must be translated into meaningful disk position data that can be utilized for useful purposes.

Employed to this end are digital data generator circuits 390, 392, 394, 396, 398, 400 and 402 connected to the outputs of the respective AND gates 358–370. The data generator circuits 390–402 produce the meaningful digital position data [000], [001], [010], [011], [1003, [101] and [111], respectively, when the corresponding AND gates 358–370 go high.

Fifth Form

Figure 8:
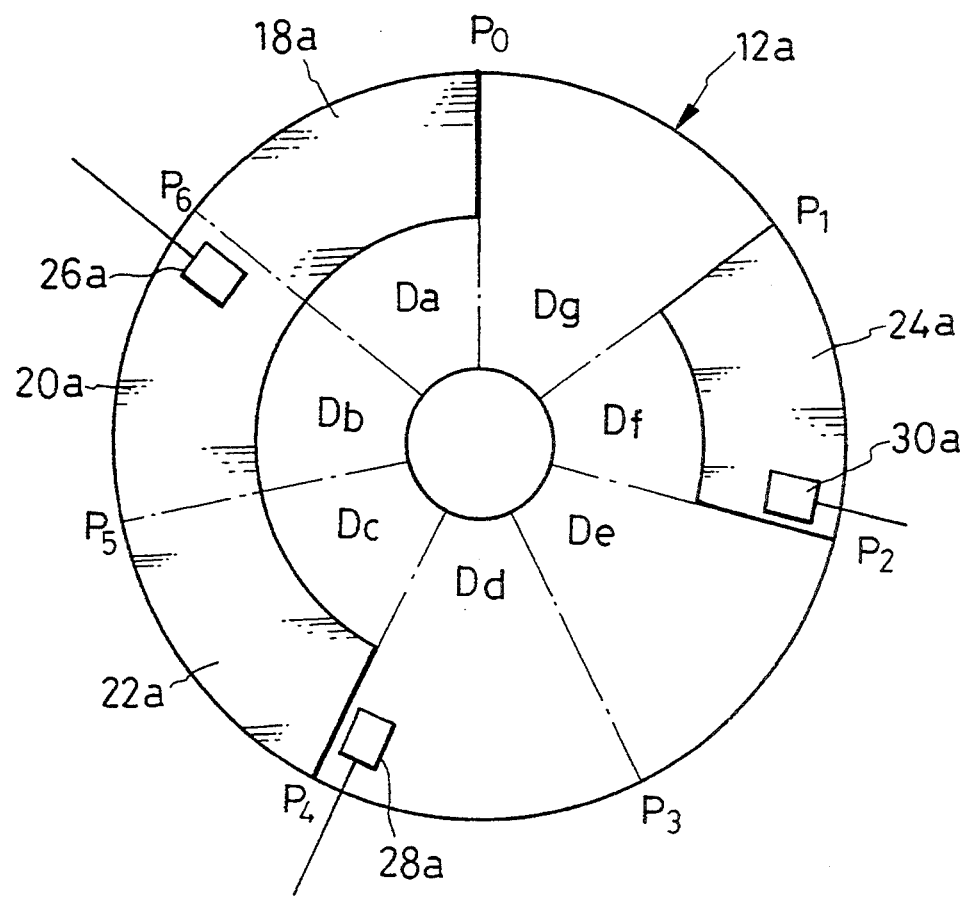
FIG. 8 is a schematic illustration of an alternative rotary disk to be employed in substitution for that of the FIG. 1 embodiment, the alternative rotary disk being shown together with associated detectors.

FIG. 8 shows a slight modification of the FIG. 1 embodiment, featuring a rotary disk 12a of a constant radius. Instead of the radial extensions 18, 20, 22 and 24 of the FIG. 1 rotary disk, the modified rotary disk 12a has four electrically conductive regions 18a, 20a, 22a and 24a arranged in radial alignment with the disk sectors Da, Db, Dc and Dr, respectively. Three switch contacts 26a, 28a and 30a are provided for detecting the conductive regions 18a, 20a, 22a and 24a. The other details of construction are as set forth above with reference to FIGS. 1–4.

As another slight modification of the FIG. 1 embodiment, the conductive regions 18a, 20a, 22a and 24a of FIG. 8 may be replaced by magnetic regions. Magnetic detectors may then be employed in place of the switch contacts 26a, 28a and 30a.

Possible Modifications

Although we have shown and described our invention in terms of some preferable embodiments thereof, we do not wish our invention to be limited by the exact details of the foregoing disclosure. The following, then, is a brief list of possible modifications and alterations of the illustrated embodiments which we believe all fall within the scope of our invention:

1. The provision of the three detectors for the rotary or linearly displaceable member having seven constituent parts to be detected is not essential. Up to seven detectors could be employed.

2. The parts to be detected could be arranged in conformity with the output pulse arrangement of a more than three bit maximum sequence pseudorandom pulse generator, provided that there were provided detectors not less in number than the bits of the pulse generator.

3. The four radial extensions of the FIG. 1 rotary disk could be disposed for joint rotation in different planes.

4. In the FIG. 1 embodiment, for example, the radial extensions of the rotary disk could be provided in conformity with the low sections of the pseudorandom pulse cycle depicted in FIG. 4.

5. Also in the FIG. 1 embodiment, the disk with the radial extensions could be fixed, and the photocouplers could be mounted to a suitable carrier for joint rotation therewith relative to the disk.

6. Both the radial disk extensions of the FIG. 1 embodiment and the opaque strip sections of the FIG. 5 embodiment could be provided so as to represent two or more cycles of maximum sequence pseudorandom pulses.

What we claim is:

1. A position signal generator comprising:
   (a) a member;
   (b) a plurality of detectors each capable of producing binary zero and one outputs;
   (c) either the member or the detectors being movable relative to the other along a predetermined path, the detectors being disposed along the predetermined path;
   (d) the member being notionally divided into a series of sections extending along the predetermined path, each section having the same dimension in a direction parallel to the predetermined path, the sections including detectable sections which are detectable by the detectors, and undetectable sections which are undetectable by the detectors, the number of the sections including the detectable and the undetectable sections being $2^n-1$, n being an integer of more than one, the detectable and the undetectable sections being arranged in a uniquely identifiable pattern in conformity with an arrangement of maximum sequence pseudorandom pulses;
   (e) the detectors being disposed with spacing each greater than or equal to the dimension of each section of the member in a direction parallel to the predetermined path so that with the relative movement of the member and the detectors along the predetermined path, the detectors simultaneously produce a pattern of the binary zero and one outputs in various predetermined unique combinations concurrently representing a series of independently unique relative positions of the stationary member with respect to the detectors, the number of the detectors being from n to $2^n-1$; and
   (f) position data generator means having stored therein the predetermined unique combinations of position data concurrently representing the series of independently unique relative positions of the member and the detectors, the position data generator means being connected to the detectors for translating each output combination of the detectors into a corresponding one of the predetermined unique combinations of position data.

2. A position signal generator comprising:
   (a) a plurality of fixed detectors capable of simultaneously producing binary zero and one outputs;
   (b) a rotary disk rotatable relative to the detectors about a predetermined axis, the disk being notionally divided into a plurality of sectors of the same angle about the predetermined axis, with the disk sectors including detectable sectors which are detectable by the detectors, and undetectable sections which are undetectable by the detectors, the angle of each sector of the disk being $360/(2^n-1)$ degrees, n being an integer of more than one, the detectable and the undetectable sections being arranged in a uniquely identifiable pattern in conformity with an arrangement of maximum sequence pseudorandom pulses;

(c) the detectors being disposed about the disk axis with angular spacings each greater than or equal to the angle of each disk sector so that at the conclusion of the rotation of the disk the detectors simultaneously produce a pattern of the binary zero and one outputs in various predetermined unique combinations concurrently representing a series of independently unique angular positions of the stationary disk with respect to the detectors, the number of the detectors being from n to $2^n-1$; and (d) position data generator means having stored therein the predetermined unique combinations of position data concurrently representing the series of independently unique angular positions of the disk, the position data generator means being connected to the detectors for translating each output combination of the detectors into a corresponding one of the predetermined unique combinations of position data.

3. A position signal generator comprising:

(a) a plurality of fixed detectors capable of producing binary zero and one outputs;

(b) an endless strip of flexible material longitudinally movable relative to the detectors along a predefined closed path, the endless strip being notionally transversely divided into a series of sections of the same dimension in the longitudinal direction of the endless strip, with the sections including detectable sections which are detectable by the detectors, and undetectable sections which are undetectable by the detectors, the number of the sections including the detectable and the undetectable sections being $2^n-1$, n being an integer of more than one, the detectable and the undetectable sections being arranged on the endless strip in a uniquely identifiable pattern, in conformity with an arrangement of maximum sequence pseudorandom pulses;

(c) the detectors being disposed along the predefined closed path of the endless strip with spacings each longer than or equal to the dimension of each strip section in the longitudinal direction of the endless strip so that with the movement of the endless strip relative to the detectors, the detectors simultaneously produce a pattern of the binary zero and one outputs in various predetermined unique combinations concurrently representing a series of uniquely independent longitudinal positions of the endless strip with respect to the detectors, the number of the detectors being from n to $2^n-1$; and (d) position data generator means having stored therein predetermined unique position data concurrently representing the series of uniquely independent longitudinal positions of the endless strip, the position data generator means being connected to the detectors for translating each output combination of the detectors into a corresponding one of the predetermined unique position data.

4. A position signal generator comprising:

(a) a plurality of detectors capable of simultaneously producing a pattern of binary zero and one outputs;

(b) a first member notionally divided into a series of sections extending in a predetermined direction, each section being of the same dimension in the predetermined direction, with the sections including detectable sections which are detectable by the detectors, and undetectable sections which are undetectable by the detectors, the number of the sections including the detectable and the undetectable sections being $2^n-1$, n being an integer of more than one, the detectable and the undetectable sections being arranged in a uniquely identifiable pattern in conformity with an arrangement of maximum sequence pseudorandom pulses;

(c) a second member movable in the predetermined direction relative to the first member;

(d) the detectors being mounted to the second member and aligned in the predetermined direction with spacings each greater than or equal to the dimension of each section of the first member in the predetermined direction so that with the relative movement of the first and the second member, the detectors simultaneously produce a pattern of the binary zero and one outputs in various predetermined unique combinations concurrently representing a series of uniquely independent relative positions of the first and the second member, the number of the detectors being from n to $2^n-1$; and (e) position data generator means having stored therein predetermined unique position data concurrently representing the series of uniquely independent relative positions of the first and the second member, the position data generator means being connected to the detectors for translating each output combination of the detectors into a corresponding one of the predetermined unique position data.

5. A position signal generator comprising:

(a) a plurality of detectors each capable of producing binary zero and one outputs;

(b) a fixed base member;

(c) a strip of a preselected material formed on the base member and notionally transversely divided into a series of sections of the same dimension in the longitudinal direction of the strip, with the sections including detectable sections which are detectable by the detectors, and undetectable sections which are undetectable by the detectors, the number of the sections including the detectable and the undetectable sections being $2^n-1$, n being an integer of more than one, the detectable and the undetectable sections being arranged in a uniquely identifiable pattern in conformity with an arrangement of maximum sequence pseudorandom pulses;

(d) a carriage movable relative to the base member in the longitudinal direction of the strip;

(e) the detectors being mounted to the carriage and aligned in the longitudinal direction of the strip with spacings each greater than or equal to the dimension of each strip section in the longitudinal direction of the strip so that with the movement of the carriage relative to the base member, the detectors simultaneously produce a pattern of the binary zero and one outputs in various predetermined unique combinations concurrently representing a series of uniquely independent positions of the carriage with respect to the strip, the number of the detectors being from n to $2^n-1$; and (f) position data generator means having stored therein the predetermined unique combinations of position data concurrently representing the series of uniquely independent position of the carriage with respect to the strip, the position data generator means being connected to the detectors for translating each output combination of the detectors into a corresponding one of the predetermined unique combinations of position data.

6. The position signal generator of claim 1, 2, 3, 4 or 5 wherein the position data generator means comprises a microcomputer including a read only memory having the meaningful position data stored thereon.

7. The position signal generator of claim 1, 2, 3, 4 or 5 wherein the position data generator means comprises:
  (a) a plurality of data generator circuits having the meaningful position data stored respectively in said data generator; and
  (b) logic circuit means connected between the detectors and the data generator circuits, the logic circuit means being responsive to each output combination of the detectors for causing the data generator circuits to put out a corresponding one of the meaningful position data.

8. The position signal generator of claim 1, 2, 3, 4 or 5 further comprising a digital to analog converter connected to the position data generator means for converting the meaningful position data from digital to analog form.

9. The position signal generator of claim 2 wherein the detectable sectors of the disk have each a radial extension, and wherein the detectors are photocouplers capable of detecting the radial extensions of the detectable sectors.

10. The position signal generator of claim 2 wherein the detectable sectors of the disk have electrically conductive surfaces, and wherein the detectors are switch contacts capable of sliding engagement with the conductive surfaces.

11. The position signal generator of claim 3 wherein the detectors are photocouplers, and wherein the detectable sections of the endless strip are opaque whereas the undetectable sections are transparent.

12. The position signal generator of claim 5 wherein the strip is of an electrically conducting material, wherein the detectable sections of the strip have each an extension in a transverse direction of the strip, and wherein the detectors are sliding contacts movable into and out of sliding engagement with the transverse extensions of the detectable strip sections.

* * * * *

UNITED STATES PATENT AND TRADEMARK OFFICE
CERTIFICATE OF CORRECTION

PATENT NO. : 5,444,613
DATED : August 22, 1995
INVENTOR(S) : Makoto Tani and Takashi Nishijima It is certified that error appears in the above-indentified patent and that said Letters Patent is hereby corrected as shown below:

Column 7, Line 47, after "18," change "21," to --20,--.

Column 8, Line 27, after "and" change "228" to --230--.

Column 9, Line 15, after "360" delete "and".

Column 9, Line 18, after "366" add --, 368--.

Column 9, Line 26, after "[011]," change "[1003," to --[100],--.

Column 9, Line 37, after and" change "Dr," to --Df,--.

Signed and Sealed this

Twenty-first Day of November, 1995

Attest:

BRUCE LEHMAN

Attesting Officer

Commissioner of Patents and Trademarks